United States Patent
Thiel, V

[11] Patent Number: 5,880,627
[45] Date of Patent: Mar. 9, 1999

[54] LOW POWER OP-AMP CIRCUIT WITH BOOSTED BANDWIDTH

[75] Inventor: Frank L. Thiel, V, Austin, Tex.

[73] Assignee: Texas Instruments Incorporated, Dallas, Tex.

[21] Appl. No.: 778,424

[22] Filed: Dec. 26, 1996

Related U.S. Application Data

[60] Provisional application No. 60/009,980, Dec. 27, 1995.

[51] Int. Cl.$^6$ .................... H03F 3/45; H03F 1/02
[52] U.S. Cl. ............ 327/562; 327/65; 327/362; 330/126; 330/151; 330/253; 330/255
[58] Field of Search .................. 327/52, 53, 63, 327/65, 66, 76, 96, 390, 407, 547, 560, 561, 562, 362; 330/125, 126, 151, 253, 255

[56] References Cited

U.S. PATENT DOCUMENTS

| | | | |
|---|---|---|---|
| 3,573,644 | 4/1971 | Evel | 330/69 |
| 4,980,651 | 12/1990 | Koullias | 330/126 |
| 5,177,451 | 1/1993 | Lehmann | 330/263 |
| 5,200,709 | 4/1993 | Saito et al. | 330/126 |
| 5,461,342 | 10/1995 | Crabtree | 330/252 |
| 5,625,318 | 4/1997 | Sevenhans et al. | 327/563 |

FOREIGN PATENT DOCUMENTS

| | | | |
|---|---|---|---|
| 710380 | 6/1954 | United Kingdom | 330/125 |

*Primary Examiner*—Timothy P. Callahan
*Assistant Examiner*—Terry L. Englund
*Attorney, Agent, or Firm*—Alan K. Stewart; Wade James Brady, III; Richard L. Donaldson

[57] ABSTRACT

A low-power op-amp circuit (70) having boosted bandwidth comprises a DC circuit block (72) which is coupled to first ($V_{DC}+$, $V_{DC}+$, $V_{AC}+$) and second ($V_{DC}-$, $V_{AC}$) input nodes and to an output node ($V_{OUT}$) of an output stage (90). The DC circuit block (72) amplifies a differential signal received from the first ($V_{DC}+$, $V_{AC}+$) and second ($V_{DC}-$, $V_{AC}$) input nodes, and provides an amplified signal to the output node ($V_{OUT}$). An AC circuit block (74) is coupled to the output (NODE 3) of the DC circuit block (72). The AC circuit block (74) is operable to monitor a transient change between the first ($V_{DC}+$, $V_{AC}+$) and the second ($V_{DC}-$, $V_{AC}-$) input nodes. The AC circuit block (74) is further operable to transfer charge to the output node ($V_{OUT}$) in response to the transient change, thereby providing boosted bandwidth beyond that of the DC circuit block (72) alone.

1 Claim, 3 Drawing Sheets

5,880,627

LOW POWER OP-AMP CIRCUIT WITH BOOSTED BANDWIDTH

This application claims priority under 35 USC §119(e)(1) of provisional application No. 60/009,880 filed Dec. 27, 1995.

TECHNICAL FIELD OF THE INVENTION

This invention relates in general to the field of electronic circuits, and more particularly to a low power op-amp circuit with boosted bandwidth and method of construction.

BACKGROUND OF THE INVENTION

Conventional low-power circuits often are plagued by having slow response times. Some low-power circuits are used to implement non-static systems in which charge is moved to and from inherent device capacitances due to the non-static system functionality. When the power consumed by such a circuit is reduced, the speed at which the circuit can redistribute charge between these capacities is also reduced.

Specifically, low-power operational amplifiers (op-amps) and voltage regulators generally have bandwidths significantly lower than higher-power counterparts. This translates to greater system noise and an inability to regulate high-frequency load or supply transients. It is desirable to have an low-power op-amp or voltage regulator circuit that has the ability to redistribute charge rapidly in order to regulate high frequency transients.

SUMMARY OF THE INVENTION

Therefore, a need has arisen for a low-power op-amp circuit that has boosted bandwidth.

In accordance with the present invention, a low-power op-amp circuit with boosted bandwidth and a method of construction are provided that substantially eliminate or reduce disadvantages and problems associated with previously developed low-power circuits.

According to one embodiment of the present invention, a low-power op-amp circuit having boosted bandwidth is provided. The op-amp circuit comprises a DC circuit block that is coupled to a first and a second input node and to an output node. The DC circuit block is operable to amplify a differential signal received from the first and second input nodes, and to provide an amplified signal to the output node. An AC circuit block is coupled to a third and a fourth input node and to the output node. The AC circuit block is operable to monitor a transient change between the third and the fourth input nodes. The AC circuit block is further operable to transfer charge to the output node in response to the transient change, thereby providing boosted bandwidth beyond that of the DC circuit block alone.

A technical advantage of the present invention is the use of two separate circuit blocks within an op-amp in order to provide a boosted bandwidth performance. Such an op-amp can be used to regulate the voltage on the output of a linear voltage regulator or in other control blocks. According to the present invention, the first circuit block operates to maintain the correct DC state and is referred to as the DC circuit block. The second circuit block maintains high frequency AC regulation and is referred to as the AC circuit block. According to the present invention, the DC circuit block can be optimized to use very little power and allowed to have a poor AC response. The AC circuit block can be optimized for high frequency response and use virtually no DC current. Consequently, low power operation is maintained with boosted bandwidth allowing a dramatically improved high frequency response while using relatively little quiescent current.

A technical advantage of the present invention is this provision of a low-current op-amp having boosted bandwidth by implementing two separate circuit blocks. The DC circuit block runs at a low current and performs the amplifier function, but restricts the DC block to low frequency operation. The AC circuit block is an AC optimized system that uses very little current but constructs a high-frequency transfer function to boost bandwidth and stability.

When used as the error amplifier in a linear voltage regulator, the op-amp circuit of the present invention provides technical advantages by which the low-power voltage regulator circuit can have both a small standby current and a relatively high frequency response to maintain stability and bandwidth of the regulated voltage.

Another technical advantage of the present invention is the provision of a switch mode AC circuit block operable to inject current in response to changes in the output voltage level. This AC circuit block provides an op-amp having a boosted bandwidth AC regulation response with low power consumption.

BRIEF DESCRIPTION OF THE DRAWINGS

A more complete understanding of the present invention and advantages thereof may be acquired by referring to the following description taken in conjunction with the accompanying drawings wherein.

DETAILED DESCRIPTION OF THE INVENTION

Figure 1:
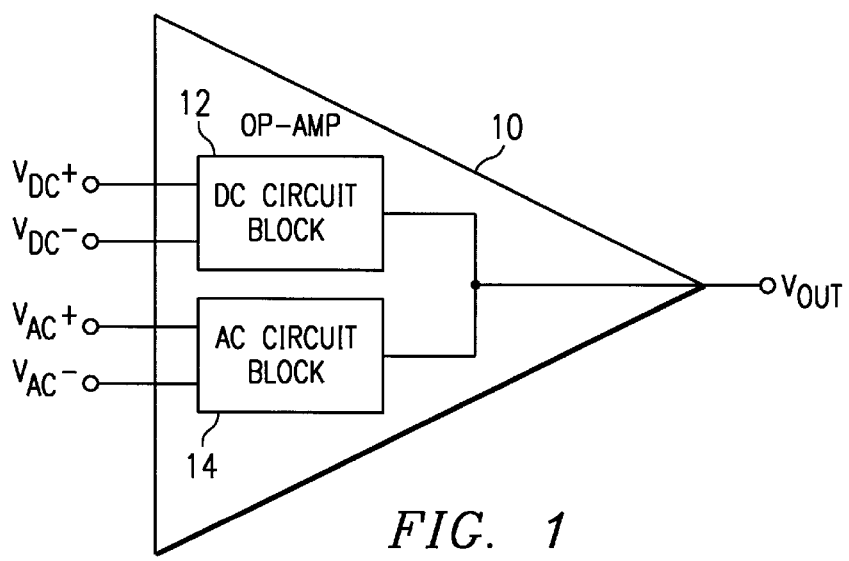
FIG. 1 is a block diagram of one embodiment of a low-power op-amp circuit with boosted bandwidth constructed according to the teachings of the present invention.

FIG. 1 is a block diagram of a low-power op-amp circuit 10 with boosted bandwidth constructed according to the teachings of the present invention. Op-amp circuit 10 receives a first input, $V_{DC}+$, a second input, $V_{DC}-$, a third input, $V_{AC}+$, and a fourth input $V_{AC}-$. Op-amp circuit 10 provides an output, $V_{OUT}$.

Op-amp circuit 10 comprises a DC circuit block 12 and an AC circuit block 14. DC circuit block 12 and AC circuit block 14 receive the inputs $V_{DC}+$, $V_{DC}-$, $V_{AC}+$ and $V_{AC}-$ and provide separate components of the output $V_{OUT}$.

In operation, op-amp circuit 10 provides functionality analogous to that of a conventional op-amp but having boosted bandwidth. DC circuit block 12 maintains a correct DC state and is optimized to use very little power. DC circuit block 12 can be non-optimized with respect to AC response. AC circuit block 14, on the other hand, is optimized for high frequency response and uses little DC current.

A technical advantage of the present invention is the use of two separate circuit blocks within an op-amp in order to provide a boosted bandwidth performance. Such an op-amp can be used to regulate the voltage on the output of a linear voltage regulator or in other DC control blocks. According to the present invention, the first circuit block operates to maintain the correct DC state and is referred to as the DC circuit block. The second circuit block maintains high frequency AC regulation and is referred to as the AC circuit block. According to the present invention, the DC circuit block can be optimized to use very little power and allowed to have a poor AC response. The AC circuit block can be optimized for high frequency response and use virtually no DC current. Consequently, low power operation is maintained while high frequency response is dramatically improved.

Op-amp circuit 10 of FIG. 1 provides benefits to numerous circuit implementations which use op-amp circuits. For example, a conventional design for a low-power linear voltage regulator with a PMOS output has an error amplifier biased at a current too low to supply enough drive to compensate for the inherent capacitance of the PMOS gate. This either causes high frequency oscillation or causes the use of an extremely large output capacitor which in turn reduces the bandwidth of the circuit. The op-amp circuit of the present invention provides technical advantages by which a low-power voltage regulator circuit can have both a small standby current and a relatively high frequency response to maintain the stability and bandwidth of the voltage regulator.

The frequency response of a conventional DC linear voltage regulator with a PMOS transistor output may be limited at higher frequencies. Such systems generally have two significant low frequency poles in their transfer functions. The first pole of the system often is dominated by the parallel combination of the output impedance of the PMOS transistor and any load resistance coupled with the load capacitor. The second pole often is controlled by the output impedance of the amplifier in the voltage regulator feedback block coupled with the gate capacitance of the output device. It should be understood that with a high output impedance op-amp, as would be true if little current were biased into the output stage of the op-amp, this second pole is a relatively low frequency pole. This is especially true in the case of a large output PMOS transistor with its associated large gate capacitance. As a consequence, the conventional two-pole frequency response creates an unstable voltage regulator system unless the output capacitor is made significantly large, reducing the ability to compensate for high frequency stimuli.

Conventional solutions to this problem boost the amplifier current to the point where the second pole falls at a frequency far enough above the first pole as to give a substantially one-pole response with a corresponding phase margin near 90°. It should be understood that the first pole does not alleviate a second pole that is too low.

A technical advantage of the present invention is the provision of a low-current op-amp having boosted bandwidth by implementing two separate circuit blocks. The DC circuit block runs at a low current and performs the amplifier function, but restricts the DC block to low frequency operation. The AC circuit block is an AC optimized system that uses very little current but constructs a high-frequency transfer function to boost bandwidth and stability.

Figure 2:
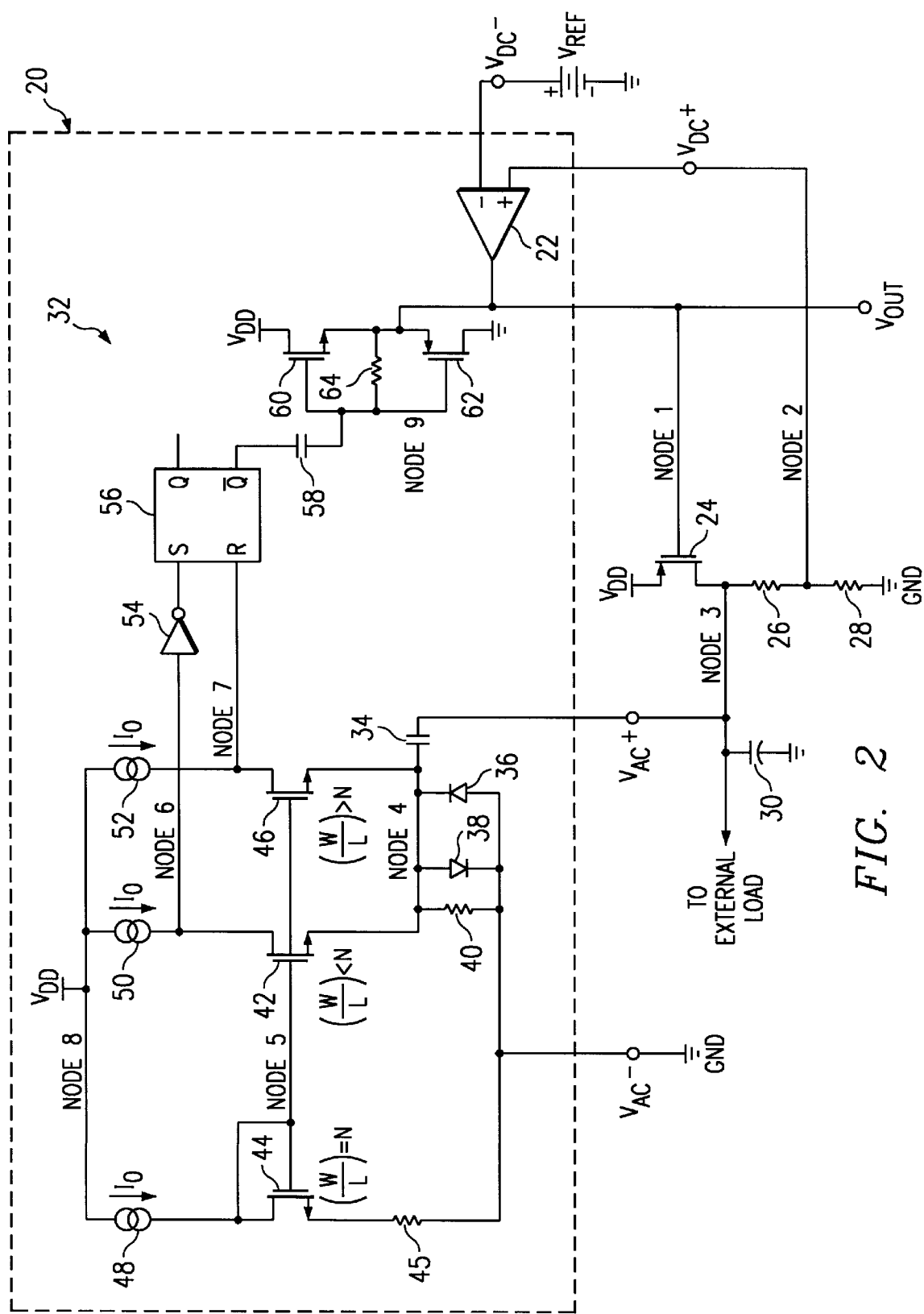
FIG. 2 is a circuit diagram of one embodiment of an op-amp constructed according to the teachings of the present invention.
Figure 3:
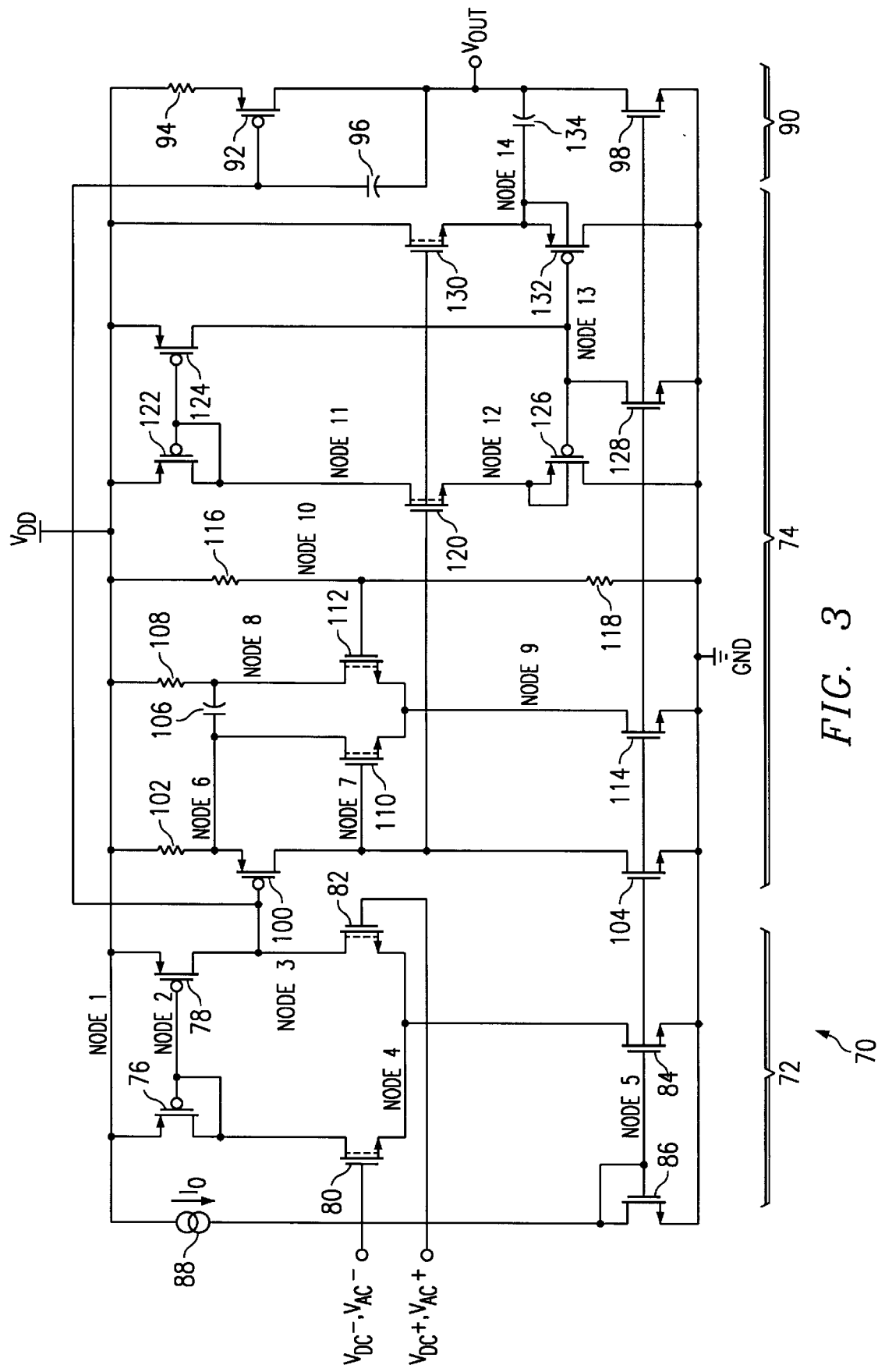
FIG. 3 is a circuit diagram of a second embodiment of the op-amp constructed according to the teachings of the present invention.

FIGS. 2 and 3 illustrate circuit diagrams of embodiments of op-amps implementing separate DC and AC circuit blocks according to the teachings of the present invention.

FIG. 2 is a circuit diagram of one embodiment of an op-amp circuit 20 constructed according to the teachings of the present invention. This op-amp circuit 20 is shown as the error amplifier of a linear voltage regulator. Op-amp circuit 20 provides a switch mode boosted bandwidth. Op-amp circuit 20 comprises an amplifier 22 which receives two inputs, $V_{DC}-$ and $V_{DC}+$, and provides an output to a first node, NODE 1, as shown. Amplifier 22 comprises the DC circuit block of circuit 20. The first input of amplifier 22, $V_{DC}-$, is connected to a voltage reference which provides a voltage level $V_{REF}$. The output of amplifier 22 is connected to NODE 1, and the second input of amplifier 22 is connected to a second node, NODE 2.

The components of the associated linear voltage regulator are now described and should be understood to be one application for the op-amp circuit of the present invention. A PMOS transistor 24 has a gate, a source and a drain. The gate of PMOS transistor 24 is connected to NODE 1. The source of PMOS transistor 24 is connected to the supply voltage $V_{DD}$, and the drain of PMOS transistor 24 is connected to a third node, NODE 3. NODE 3 is connected to an external load, as shown. A resistor 26 is connected between NODE 2 and NODE 3, and a second resistor 28 is connected between NODE 3 and ground potential. A capacitor 30 is connected between NODE 3 and ground potential and represents the load capacitance. As shown, the plus input of amplifier 22 is connected to NODE 2 to close the negative feedback loop.

Op-amp circuit 20 further comprises an AC circuit block, indicated generally at 32. AC circuit block 32 is connected to NODE 1 ($V_{OUT}$), NODE 3 ($V_{AC}+$) and ground ($V_{AC}-$). In AC circuit block 32, a capacitor 34 is connected between NODE 3 and a fourth node, NODE 4. A first diode 36 and a second diode 38 are connected between NODE 4 and the negative input, $V_{AC}-$, which is connected to ground potential, as shown. A resistor 40 also is connected between NODE 4 and the negative input.

A first transistor 42 has a gate, a source and a drain. The source of transistor 42 is connected to NODE 4, the gate of NMOS transistor 42 is connected to a fifth node, NODE 5, and the drain of NMOS transistor 42 is connected to a sixth node, NODE 6. NMOS transistor 42 is constructed to have a width to length ratio of less than an arbitrary reference value of N. A second NMOS transistor 44 also has a gate, a source and a drain. The gate and drain of NMOS transistor 44 are connected to NODE 5. A resistor 45 is connected between the source of NMOS transistor 44 and ground potential and is matched in construction and value to resister 40. The width to length of NMOS 44 is set equal to the reference value N. A third NMOS transistor 46 has a gate, a source and a drain. The gate of NMOS transistor 46 is connected to NODE 5, the source of NMOS transistor 46 is connected to NODE 4, and the drain of NMOS transistor 46 is connected to a seventh node, NODE 7. The width to length ratio of NMOS 46 is set to be greater than the reference value N. As shown, a current source 48, a current source 50, and a current source 52 provide bias or load currents to NMOS transistors 44, 42 and 46, respectively. The supply voltage $V_{DD}$ is supplied to an eighth node, NODE 8, which acts as the positive supply for op-amp circuit 20 and to which each of the current sources 48, 50 and 52 are connected.

An inverter 54 has an input and an output. The input of inverter 54 is connected to NODE 6 and the output of inverter 54 is connected to a flipflop 56. Flipflop 56 receives a set input, S, and a reset input, R. As shown, the output of inverter 54 is connected to the set input of flipflop 56. The reset input of flipflop 56 is connected to NODE 7. Flipflop 56 has an output, Q, and an inverted output, $\overline{Q}$, as shown.

A capacitor 58 is connected between the inverted output of flipflop 56 and a ninth node, NODE 9. An NMOS transistor 60 has a gate, a drain and a source. The gate of NMOS transistor 60 is connected to NODE 9, the drain of NMOS transistor 60 is connected to the supply voltage $V_{DD}$, and the source of NMOS transistor 60 is connected to the output node, NODE 1. A PMOS transistor 62 has a gate, a source and a drain. The gate of PMOS transistor 62 is connected to NODE 9, the source of PMOS transistor 62 is connected to NODE 1, and the drain of PMOS transistor 62 is connected to ground potential. A resistor 64 is connected between NODE 9 and NODE 1.

Op-amp circuit 20 of FIG. 2 operates to provide an op-amp with switch-mode boosted bandwidth. AC circuit block 32 creates bursts of current in response to deviations of the $V_{AC}+$ input voltage at NODE 3. However, the standby current in AC circuit block 32 is equal to only $2I_0$, which can be optimized to be a relatively small current.

In AC circuit block 32, when at rest, the drain of NMOS transistor 42 is at a high voltage level while the drain of NMOS transistor 46 is at a low voltage level. When the $V_{AC}+$ input voltage level of NODE 3 deviates downward, capacitor 34 draws charge from the sources of NMOS transistors 42 and 46 thus moving the respective voltage levels downward. This action switches NMOS transistor 42 into a low state and sets flipflop 56.

Consequently, the inverted output of flipflop 56 is set to a logic low. The inverted output of flipflop 56 in turn drives current through capacitor 58 to the source follower pair of NMOS transistor 60 and PMOS transistor 62. The source follower pair then operates to pull down the voltage level of NODE 1, thus causing PMOS transistor 24 to lift the voltage level at NODE 3 to compensate for the previous downward move of the $V_{AC}+$ input.

Conversely, when the $V_{AC}+$ input voltage level of NODE 3 deviates upward, the voltage level of the drain of NMOS transistor 46 moves high. This resets flipflop 56 causing the inverted output to go to a logic high. NODE 9 is then pulled high, and the voltage level of the gate of PMOS transistor 24 is driven higher, causing NODE 3 to move down to compensate for the previous upward move of the $V_{AC}+$ input.

The sensitivity of AC block circuit 32 is controlled by resistor 40. The lowest frequency at which the circuit will respond is set by the RC product of resistor 40 and capacitor 34. The RC product of capacitor 58 and resistor 64 controls the amount of current injected by AC circuit block 32.

The operation of flipflop 56 prevents oscillatory spiking by holding the previous state and only allowing a new injection of current when the rate of change of the $V_{AC}+$ input voltage at NODE 3 changes in direction. Also, when no stimulus is present, the source follower pair of NMOS transistor 60 and PMOS transistor 62 is held off and NODE 9 is primed to the DC gate voltage of output PMOS transistor 24 by resistor 64. Diodes 38 and 36 prevent the sources of NMOS transistors 42 and 46 from deviating too far from desired operating levels. The circuit is implemented such that the quiescent voltage across resistor 40 ($I_0 \times R_{40}$) is too small to forward bias diode 38.

A technical advantage of the present invention is the provision of a switch mode AC circuit block operable to inject current in response to differential changes in the voltage levels of its inputs. This AC circuit block provides an op-amp having a boosted bandwidth AC regulation response with low power consumption.

FIG. 3 is a circuit diagram of a second embodiment of an op-amp circuit constructed according to the teachings of the present invention. The op-amp circuit, indicated generally at 70, provides boosted bandwidth with low power consumption. Op-amp circuit 70 receives a first input ($V_{DC}+$, $V_{AC}+$) and a second input ($V_{DC}-$, $V_{AC}-$) and provides an output, $V_{OUT}$. Op-amp circuit 70 also receives power supply voltage, $V_{DD}$. Op-amp circuit 70 comprises a DC circuit block 72 and an AC circuit 74 block.

DC circuit block 72 comprises PMOS transistors 76 and 78. The sources of PMOS transistors 76 and 78 are connected to a first node, NODE 1, and the gates of PMOS transistor 76 and 78 are connected to a second node, NODE 2. The drain of PMOS transistor 76 is connected to NODE 2, and the drain of PMOS transistor 78 is connected to a third node, NODE 3. An NMOS transistor 80 has a gate, a drain and a source. The drain of NMOS transistor 80 is connected to NODE 2, the gate of NMOS transistor 80 is connected to the second input, $V_{DC}-$, $V_{AC}-$ and the source of NMOS transistor 80 is connected to a fourth node, NODE 4. An NMOS transistor 82 has a drain connected to NODE 3, a gate connected to the first input, $V_{DC}+$, $V_{AC}+$ and a source connected to NODE 4. An NMOS transistor 84 has a drain connected to NODE 4, a gate connected to a fifth node, NODE 5, and a source connected to ground potential. An NMOS transistor 86 has a gate and a drain connected to NODE 5. The source of NMOS transistor 86 is connected to ground potential. A current source 88 is connected between NODE 1 and NODE 5, as shown.

In operation, DC circuit block 72 provides a correct DC state for op-amp circuit 70 and uses little power. As should be understood, NMOS transistors 80 and 82 constitute a differential pair having an output node at NODE 3 which is connected to an output stage 90.

Output stage 90 comprises a PMOS transistor 92 having a gate connected to NODE 3, a drain connected to the output, $V_{OUT}$, and a source. A resistor 94 is connected between the source of PMOS transistor 92 and NODE 1. A capacitor 96 is connected between NODE 3 and the output, as shown. An NMOS transistor 98 has a drain connected to the output, a gate connected to NODE 5 and a source connected to ground potential. In operation, output stage 90 operates to drive the output of op-amp circuit 70.

AC circuit block 74 comprises a PMOS transistor 100 having a source, gate and drain. The gate of PMOS transistor 100 is connected to NODE 3, the source is connected to a sixth node, NODE 6, and the drain is connected to a seventh node, NODE 7. A resistor 102 is connected between NODE 6 and NODE 1. An NMOS transistor 104 has a drain connected to NODE 7, a gate connected to NODE 5, and a source connected to ground potential. A capacitor 106 is connected between NODE 6 and NODE 8, and a resistor 108 is connected between NODE 8 and NODE 1, as shown.

An NMOS transistor 110 has a gate connected to NODE 7, a drain connected to NODE 6, and a source connected to a ninth node, NODE 9. An NMOS transistor 112 has a drain connected to NODE 8, a source connected to NODE 9, and a gate connected to a tenth node, NODE 10. An NMOS transistor 114 has a drain connected to NODE 9, a gate connected to NODE 5, and a source connected to ground potential. A pair of resistors 116 and 118 are connected between NODE 1, NODE 10 and ground potential as shown.

An NMOS transistor 120 has a gate connected to NODE 7, a drain connected to an eleventh node, NODE 11, and a source connected to a twelfth node, NODE 12. PMOS transistors 122 and 124 have gates connected to NODE 11 and sources connected to NODE 1. The drain of PMOS transistor 122 is connected to NODE 11, and the drain of PMOS transistor 124 is connected to a thirteenth node, NODE 13. A PMOS transistor 126 has a source and a back gate connected to NODE 12, a gate connected to NODE 13, and a drain connected to ground potential.

An NMOS transistor 128 has a drain connected to NODE 13, a gate connected to NODE 5, and a source connected to ground potential. An NMOS transistor 130 has a gate connected to NODE 7, a drain connected to NODE 1 and a source connected to a fourteenth node, NODE 14. A PMOS transistor 132 has a back gate and a source connected to NODE 14, a gate connected to NODE 13, and a drain connected to ground potential. A capacitor 134 is connected between NODE 14 and the output.

In operation, AC circuit block 74 provides a fast response to changes in the output voltage provided at NODE 3 by DC circuit 72. AC circuit block 74 is optimized to provide a transfer function that boosts the bandwidth of op-amp circuit 70 to increase performance without causing a significant increase in power consumption. As should be understood, PMOS transistor 100 senses changes in the voltage level of NODE 3. The remaining devices then cause charge either to be pulled from the output by capacitor 134 or pushed into the output by capacitor 134.

DC circuit block 72 is a basic MOS differential amplifier. NMOS transistors 80 and 82 serve as the differential input stage with NMOS transistor 84 providing the tail current and PMOS transistors 76 and 78 serving as an active load. This differential stage is gained through PMOS 92 and coupled to the output, $V_{OUT}$. Due to the common source output stage and the fact that DC circuit block 72 does not need to have a high frequency response, the tail current flowing in NMOS transistor 84 and the output stage 90 load current flowing in NMOS transistor 98 can be relatively low even when driving a capacitive load on $V_{OUT}$.

AC circuit block 74 provides a rapid response to changes in the output of the DC circuit block 72 differential stage. This is done by the gain stage formed by PMOS transistor 100 and load NMOS transistor 104. In steady state operation, the differential pair formed by NMOS transistors 110 and 112 will pull enough current through resistor 102 to hold NODE 7 at approximately the same voltage as NODE 10. This, in turn, holds the class AB output stage formed by transistors 120 through 132 approximately equal to the voltage of NODE 10. To allow for a maximum deviation in either direction, resistors 116 and 118 can be made equal to each other to provide a reference of one-half of the supply voltage $V_{DD}$.

Capacitor 106 is sufficiently large that the time constant formed by resistors 102, 108 and capacitor 106 is longer than the lowest frequency at which it is desirable the AC circuit block 74 respond. Therefore, when there is an AC stimulus that is faster than this time constant, PMOS transistor 100 will pull NODE 9 in response. The class AB source follower stage formed by NMOS transistors 120, 130 and 128 and PMOS transistors 122, 124, 126 and 132 will provide a low impedance output that can deliver a large amount of current to the output $V_{OUT}$ through capacitor 134.

In this way, the bandwidth of the amplifier is boosted. The only quiescent current consumed is in resistors 116 and 118, NMOS transistors 104, 114 and 128 and PMOS transistor 122. Since the differential stage formed by NMOS transistors 110 and 112 has a deliberately low frequency response, the current through NMOS transistor 114 and resistors 116 and 118 can be set extremely low. Additionally, as the only significant load on NODE 7 is the class AB source follower which is specifically configured to allow NMOS transistors 120 and 130 to offset the capacitance of PMOS transistors 126 and 132. The current of NMOS transistor 104 can be quite low. The source follower can be biased very close to class B operation with only enough current as to minimize cross-over distortion. Therefore, the current in NMOS transistor 128 can be low. Additionally, the width and length of the MOS devices can be kept as low as provides an acceptable gain in order to minimize interstage capacitance.

Overall, the DC circuit block 72 and the AC circuit block 74 combined have each been optimized to perform their specific functions at exceedingly low currents yielding a bandwidth much higher than a typical single block device that consumed the same quiescent current.

Figure 4:
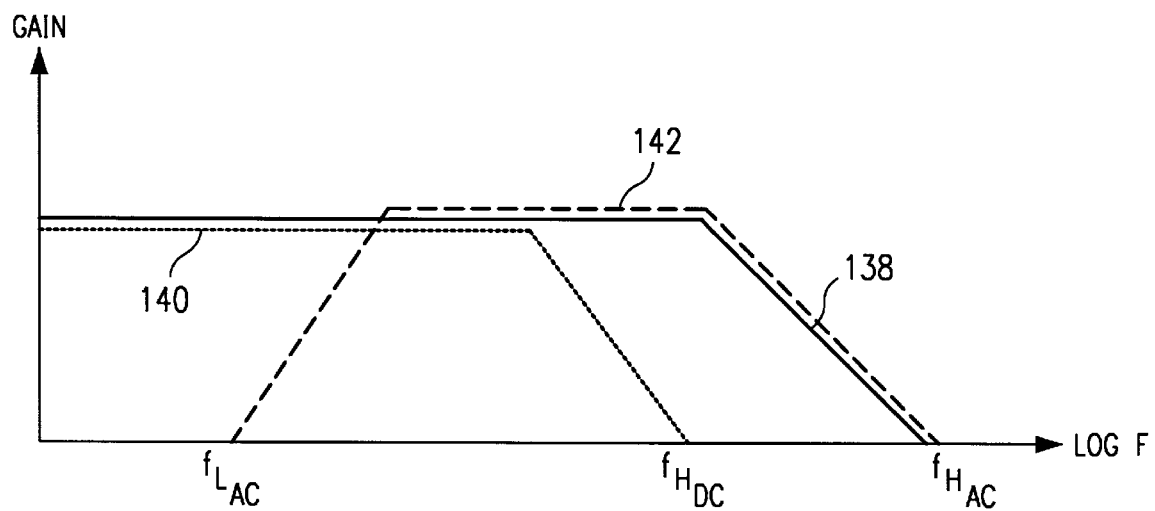
FIG. 4 illustrates one embodiment of the bandwidth of the op-amp circuit of FIG. 3.

FIG. 4 illustrates the bandwidth of one embodiment of op-amp circuit 70 of FIG. 3. As shown in FIG. 4, the log of frequency is assigned to the x-axis and the gain (in dB) of op-amp 70 is assigned to the y-axis. The transfer function 138 of op-amp circuit 70 drops to zero gain at $f_{H_{AC}}$. For one embodiment, $f_{H_{AC}}$ is approximately equal to 1 MHZ. As shown, transfer function 138 comprises two parts: a first portion 140 and a second portion 142.

First portion 140 corresponds to the transfer function provided by DC circuit block 72. Without boosted bandwidth, this function would drop to zero gain at $f_{H_{DC}}$, as shown. In one embodiment, $f_{H_{DC}}$ is approximately equal to 20 KHz. Second portion 142 corresponds to the addition of AC circuit block 74 to provide boosted bandwidth. As shown, AC circuit block 74 boosts the bandwidth of op-amp circuit 70 to provide a substantially increased frequency response.

Op-amp circuit 70 provides this boosted bandwidth with low power consumption. All load and tail currents are derived from $I_0$ which can be implemented as a relatively low current level. Due to the optimization of both the AC and DC blocks to run at low current, the total current used can be substantially lower than the current necessary for a single amplifier stage with corresponding bandwidth.

Although the present invention has been described in detail, it should be understood that various changes, substitutions and alterations can be made hereto without departing from the spirit and scope of the invention as defined by the appended claims.

What is claimed is:

1. A low-power op-amp circuit having boosted bandwidth, comprising:

a DC circuit block coupled to first and second input nodes, the DC circuit block comprising a differential amplifier operable to amplify a differential signal received from the first and second input nodes; and an AC circuit block coupled to receive the amplified differential signal from an output node of the DC circuit block, the AC circuit block comprising a differential input amplifier and a class AB source follower;

an output node of the AC circuit block providing an amplified signal responsive to transient changes between the first and the second input nodes; and an output stage having a first input node coupled to the output node of the DC circuit block and a second input node coupled to the output node of the AC circuit block.

* * * * *